US011171188B2

(12) United States Patent
Dai

(10) Patent No.: US 11,171,188 B2
(45) Date of Patent: Nov. 9, 2021

(54) ORGANIC LIGHT-EMITTING DIODE DEVICE, ORGANIC LIGHT-EMITTING DIODE DISPLAY APPARATUS, AND PREPARATION METHOD FOR ORGANIC LIGHT-EMITTING DIODE DEVICE

(71) Applicant: BOE Technology Group Co., Ltd., Beijing (CN)

(72) Inventor: Qing Dai, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 262 days.

(21) Appl. No.: 16/330,270

(22) PCT Filed: Jun. 5, 2018

(86) PCT No.: PCT/CN2018/089990
§ 371 (c)(1),
(2) Date: Mar. 4, 2019

(87) PCT Pub. No.: WO2019/001233
PCT Pub. Date: Jan. 3, 2019

(65) Prior Publication Data
US 2019/0198591 A1 Jun. 27, 2019

(30) Foreign Application Priority Data

Jun. 26, 2017 (CN) .......................... 201710494714.6

(51) Int. Cl.
*H01L 29/08* (2006.01)
*H01L 27/32* (2006.01)
(Continued)

(52) U.S. Cl.
CPC ...... *H01L 27/3246* (2013.01); *H01L 27/3248* (2013.01); *H01L 51/0005* (2013.01);
(Continued)

(58) Field of Classification Search
CPC ............. H01L 27/3246; H01L 51/0012; H01L 51/0005; H01L 51/5056; H01L 27/3297;
(Continued)

(56) References Cited

U.S. PATENT DOCUMENTS 9,508,933 B2 * 11/2016 Wang .................. H01L 51/5228
9,793,508 B2 * 10/2017 Wang .................. H01L 51/5228
(Continued)

FOREIGN PATENT DOCUMENTS

CN 102707482 A 10/2012
CN 104157675 A 11/2014
(Continued)

OTHER PUBLICATIONS

Zhuliang Yuan, Research on Novel Blue Electroluminescent Polymers and Alignment Method, Chinese Excellent Graduate Papers, 66 pages in total, Issue No. 06, published on Jun. 15, 2008 (including English translation of the abstract).

(Continued)

*Primary Examiner* — Caleb E Henry
(74) *Attorney, Agent, or Firm* — Fay Sharpe LLP

(57) ABSTRACT

There are provided an OLED device, an OLED display apparatus and a preparation method for an OLED device. The OLED device includes a pixel defining layer on a base substrate and an organic light-emitting functional layer in opening regions of the pixel defining layer, and further includes a first auxiliary electrode layer and a second auxiliary electrode layer which are arranged on the same layer The first auxiliary electrode layer and the second auxiliary electrode layer are arranged between the pixel defining layer and the base substrate, and an electric field can be formed between the first auxiliary electrode layer and the second auxiliary electrode layer. Organic light-emitting (Continued)

molecules in the organic light-emitting material are arranged directionally under the action of the electric field.

20 Claims, 3 Drawing Sheets

(51) Int. Cl.
*H01L 51/50* (2006.01)
*H01L 51/56* (2006.01)
*H01L 51/52* (2006.01)
*H01L 51/00* (2006.01)

(52) U.S. Cl.
CPC ...... *H01L 51/0012* (2013.01); *H01L 51/5056* (2013.01); *H01L 51/5212* (2013.01); *H01L 51/5228* (2013.01); *H01L 51/56* (2013.01); *H01L 27/3276* (2013.01)

(58) Field of Classification Search
CPC . H01L 51/56; H01L 51/5228; H01L 51/5212; H01L 27/3248; H01L 27/3276; H01L 51/5203
See application file for complete search history.

(56) References Cited

U.S. PATENT DOCUMENTS

| | | | |
|---|---|---|---|
| 9,818,971 | B2 | 11/2017 | Cheng et al. |
| 10,270,054 | B2* | 4/2019 | Zhang ................. H01L 51/56 |
| 2005/0116620 | A1* | 6/2005 | Kobayashi .......... H01L 51/5271 |
| | | | 313/503 |
| 2008/0048562 | A1* | 2/2008 | Matsuda ............. H01L 27/3244 |
| | | | 313/506 |
| 2012/0007083 | A1 | 1/2012 | You et al. |
| 2014/0267958 | A1* | 9/2014 | Sugita ................. G02F 1/13471 |
| | | | 349/15 |
| 2015/0001481 | A1 | 1/2015 | Park |
| 2016/0254455 | A1* | 9/2016 | Wang .................. H01L 51/5228 |
| | | | 438/23 |
| 2017/0315374 | A1* | 11/2017 | Zhou .................... G02F 1/1343 |

FOREIGN PATENT DOCUMENTS

| | | |
|---|---|---|
| CN | 106784366 A | 5/2017 |
| CN | 107331788 A | 11/2017 |

OTHER PUBLICATIONS

International Search Report (including English translation) and Written Opinion of PCT/CN2018/089990, dated Sep. 12, 2018.
First Office Action of the priority Chinese application No. 201710494714.6 dated Jul. 27, 2018 (including English translation).

* cited by examiner

ORGANIC LIGHT-EMITTING DIODE DEVICE, ORGANIC LIGHT-EMITTING DIODE DISPLAY APPARATUS, AND PREPARATION METHOD FOR ORGANIC LIGHT-EMITTING DIODE DEVICE

CROSS-REFERENCE TO RELATED APPLICATION

This application is a 371 of PCT Patent Application Serial No. PCT/CN2018/089990, filed on Jun. 5, 2018, which claims priority of Chinese Patent Application No. 201710494714.6, filed on Jun. 26, 2017 and titled "OLED Device, OLED Display Apparatus and Preparation Method for OLED Device", which is incorporated herein by reference in its entirety.

TECHNICAL FIELD

The present disclosure relates to an OLED device, an OLED display apparatus and a preparation method for an OLED device.

BACKGROUND

In the development of OLEDs (organic light-emitting diode) technologies for more than 30 years, men mainly focused on the synthesis of novel materials at the very beginning and later on the innovation of OLED device structures, which greatly promotes the performance improvement of OLED devices and the commercialization of OLEDs. The light-emitting material in the OLED device is usually an organic thin film composed of polymers or organic light-emitting molecules. However, no matter the organic thin film is composed of polymers or organic light-emitting molecules, the performance of current OLED devices is basically based on the light-emitting property of a single molecule. The organic light-emitting molecules in the organic thin film in the OLED device generally exist in an amorphous form. The amorphous organic light-emitting molecules have better surface smoothness in nanometer size and are easy to control in thickness and thus have no special restrictions on the material of the bottom layer. In addition, the preparation process is simple.

SUMMARY

Embodiments of the present disclosure provide an OLED device, an OLED display apparatus and a preparation method for an OLED device.

At least one embodiment of the present disclosure provides an OLED device, comprising a pixel defining layer, an organic light-emitting functional layer and an auxiliary electrode layer on a base substrate, wherein the organic light-emitting functional layer is in opening regions of the pixel defining layer and comprises an organic light-emitting material in which organic light-emitting molecules are directionally arranged; the auxiliary electrode layer is configured to form an electric field in the opening regions which enables the organic light-emitting molecules in the organic light-emitting material to be directionally arranged, and the organic light-emitting material is prepared through a wet process.

In an implementation of the embodiments of the present disclosure, the directional arrangement is parallel to the base substrate.

In an implementation of the embodiments of the present disclosure, the auxiliary electrode layer comprises a first auxiliary electrode layer and a second auxiliary electrode layer; wherein the first auxiliary electrode layer and the second auxiliary electrode layer are on the same layer and are encapsulated by the pixel defining layer to be between the pixel defining layer and the base substrate.

In an implementation of the embodiments of the present disclosure, the first auxiliary electrode layer and the second auxiliary electrode layer are configured to be connected with a positive pole and a negative pole of a DC power supply respectively.

In an implementation of the embodiments of the present disclosure, the first auxiliary electrode layer and the second auxiliary electrode layer are led out from different side edges of the base substrate respectively to be connected with the positive pole and the negative pole of the DC power supply.

In an implementation of the embodiments of the present disclosure, the pixel defining layer has a plurality of opening regions arranged in a matrix; each of the first auxiliary electrode layer and the second auxiliary electrode layer comprises a plurality of strip-shaped electrodes arranged in parallel; the strip-shaped electrodes in the first auxiliary electrode layer and the strip-shaped electrodes in the second auxiliary electrode layer are alternately arranged at intervals, and the strip-shaped electrodes are arranged in one of the following two ways: one strip-shaped electrode is arranged between two adjacent rows of opening regions, and one strip-shaped electrode is arranged between two adjacent columns of opening regions.

Exemplarily, the auxiliary electrode layer is made of one of the following materials: aluminium, molybdenum, neodymium and silver, and or an alloy formed by at least two of: aluminium, molybdenum, neodymium and silver.

In the present embodiments, the OLED device further comprises a first electrode layer and a second electrode layer, wherein the first electrode layer is between the organic light-emitting functional layer and the base substrate and is spaced apart from the auxiliary electrode layer, and the second electrode layer is on the organic light-emitting functional layer.

Exemplarily, the first electrode layer is one of an anode layer and a cathode layer, and the second electrode layer is the other one of the anode layer and the cathode layer.

At least one embodiment of the present disclosure provides an OLED display apparatus, comprising an OLED device mentioned above.

At least one embodiment of the present disclosure provides a preparation method for an OLED device for preparing the OLED device mentioned above. The method comprises: forming an auxiliary electrode layer and a pixel defining layer on a base substrate; preparing an organic light-emitting material in opening regions of the pixel defining layer through a wet process, and forming an electric field which enables organic light-emitting molecules in the organic light-emitting material to be arranged directionally in the opening regions of the pixel defining layer through the auxiliary electrode layer.

Exemplarily, forming the auxiliary electrode layer and the pixel defining layer on the base substrate comprises: forming a first auxiliary electrode layer and a second auxiliary electrode layer on the base substrate through a one-time process, wherein the auxiliary electrode layer comprises the first auxiliary electrode layer and the second auxiliary electrode layer; and forming the pixel defining layer on the first auxiliary electrode layer and the second auxiliary electrode layer through a one-time process, wherein both the first auxiliary electrode layer and the second auxiliary electrode layer are encapsulated by the pixel defining layer to be between the pixel defining layer and the base substrate.

Exemplarily, forming the electric field which enables organic light-emitting molecules in the organic light-emitting material to be arranged directionally in the opening regions of the pixel defining layer through the auxiliary electrode layer comprises: connecting the first auxiliary electrode layer and the second auxiliary electrode layer with a positive pole and a negative pole of a DC power supply respectively and turning on the DC power supply.

In the present embodiments, before forming the pixel defining layer on the first auxiliary electrode layer and the second auxiliary electrode layer through the one-time patterning process, the method further comprises: forming a first electrode layer on the base substrate through the one-time patterning process, wherein the first electrode layer is spaced apart from the first auxiliary electrode layer and the second auxiliary electrode layer respectively.

In the present embodiments, the method further comprises: drying the organic light-emitting material; and forming the electric field which enables organic light-emitting molecules in the organic light-emitting material to be arranged directionally in the opening regions of the pixel defining layer through the auxiliary electrode layer comprises: loading an electrical signal to the auxiliary electrode layer after the organic light-emitting material is dried for a pre-set time duration, to generate the electric field in the opening regions of the pixel defining layer.

DETAILED DESCRIPTION

To describe the principle and advantages of the present disclosure more clearly, the embodiments of the present disclosure will be further described in detail below with reference to the accompanying drawings.

However, in the traditional view, the organic light-emitting molecules in the organic thin film in an OLED device must be amorphous, that is, the molecular orientation is random and isotropous, such that the uniformity of the organic thin film can be ensured and then the performance of the OLED device is ensured.

In recent years, with the intensive research on organic semiconductors and the increasing attention to the intermolecular interaction, it has been found that the existing form and specific orientation of the organic light-emitting molecules in the organic thin film have an obvious influence on the performance of OLED devices, which is significantly different from the traditional view. When the organic light-emitting molecules are in a certain specific orientation, they can enhance the light-emitting efficiency of the OLED device or increase the mobility of carriers and thereby improve the performance, such as power efficiency or service life.

In the related art, the orientation of the organic light-emitting molecules is generally achieved by controlling the temperature of a substrate or the selection of a solvent. For example, during vacuum evaporation, the orientation arrangement of the organic light-emitting molecules is adjusted by controlling the temperature of the substrate. However, this orientation method for organic light-emitting molecules is usually applicable for OLED devices prepared through a vacuum evaporation process only rather than OLED devices prepared through wet processes such as ink-jet printing.

Figure 1:
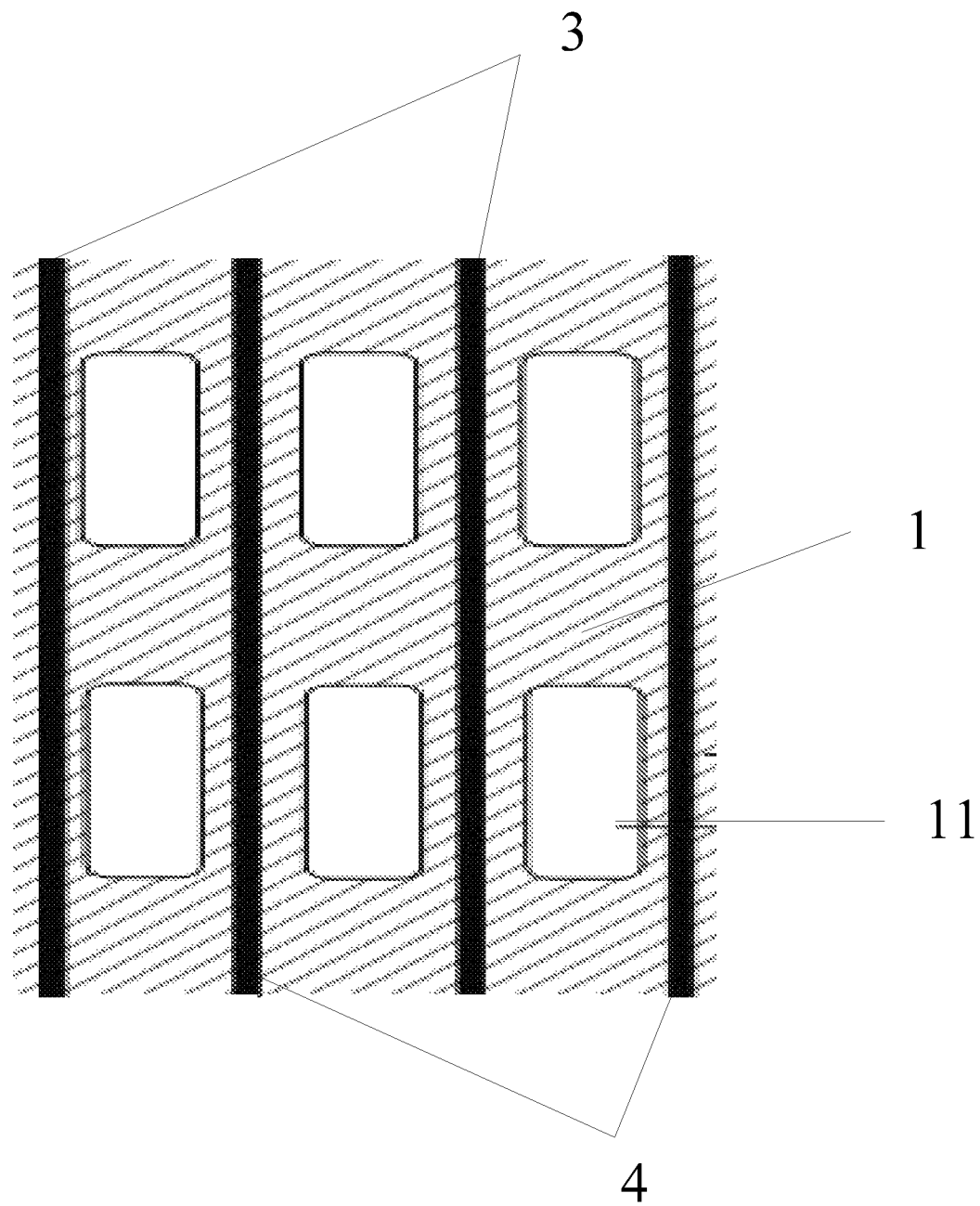
FIG. 1 is a top view of an OLED device according to an embodiment of the present disclosure.
Figure 2:
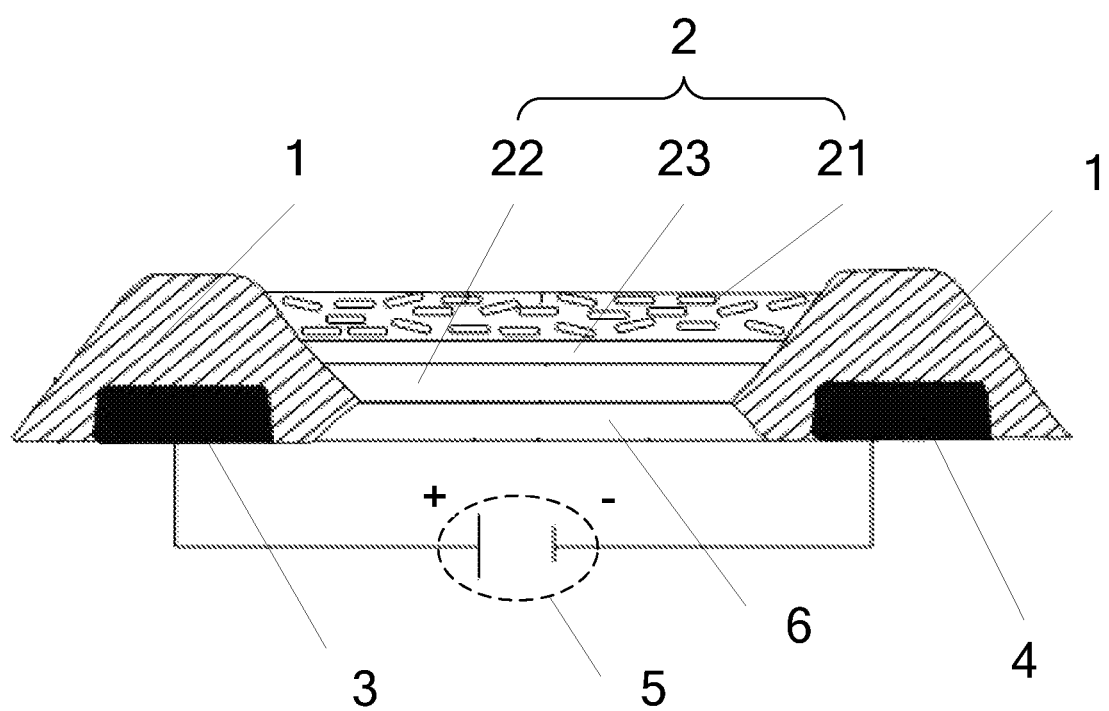
FIG. 2 is a sectional view of an OLED device according to an embodiment of the present disclosure.

FIG. 1 is a top view of an OLED device according to an embodiment of the present disclosure, and FIG. 2 is a sectional view of an OLED device according to an embodiment of the present disclosure. As shown in FIGS. 1 and 2, the OLED device provided in the embodiments of the present disclosure includes a pixel defining layer 1 and an organic light-emitting functional layer 2 formed on a base substrate (not shown in the figure). In the embodiments of the present disclosure, by way of example, the OLED device is an OLED device prepared through a wet process. Therefore, the organic light-emitting functional layer 2 includes an organic light-emitting material 21 prepared through a wet process, and the organic light-emitting molecules in the organic light-emitting material 21 are directionally arranged. The pixel defining layer 1 has a plurality of opening regions 11 arranged in a matrix. The various opening regions 11 are in one-to-one correspondence with the sub-pixels of the OLED device respectively. The organic light-emitting functional layer 2 is in the opening region 11 of the pixel defining layer 1.

FIG. 1 shows a cross-section diagram of the opening region 11 in the vertical plane. In this direction, the shape of the opening region 11 may be an inverted trapezoidal as shown in the figure, and may be a rectangular, etc. The above description of the shape of the opening region 11 is exemplary only. In other embodiments, the cross-section shape and the opening shape of the opening region 11 may also be in other implementations.

With reference to FIGS. 1 and 2, the OLED device further includes an auxiliary electrode layer on the base substrate, and the auxiliary electrode layer includes a first auxiliary electrode layer 3 and a second auxiliary electrode layer 4. The first auxiliary electrode layer 3 and the second auxiliary electrode layer 4 are arranged on the same layer and are arranged between the pixel defining layer 1 and the base substrate. That is, the pixel defining layer 1 covers the first auxiliary electrode layer 3 and the second auxiliary electrode layer 4, and the first auxiliary electrode layer 3 and the second auxiliary electrode layer 4 are encapsulated by the pixel defining layer 1 to be between the pixel defining layer 1 and the base substrate. The first auxiliary electrode layer 3 and the second auxiliary electrode layer 4 can form an electric field in the opening region 11 of the pixel defining layer 1 when the organic light-emitting material is prepared, so as to enable organic light-emitting molecules in the organic light-emitting material 21 to be arranged directionally under the action of the electric field.

The wet processes include, but are not limited to, processes such as ink-jet printing and spin coating for preparing the organic light-emitting material with a solution.

The OLED device may be an AMOLED (active-matrix organic light-emitting diode) device and may also be a PMOLED (passive matrix organic light-emitting diode) device. When the OLED device is an AMOLED device, the first auxiliary electrode layer 3 and the second auxiliary electrode layer 4 are indirectly arranged on the base substrate, and a thin film transistor is further arranged between the base substrate and each of the first auxiliary electrode layer 3 and the second auxiliary electrode layer 4. When the OLED device is a PMOLED device, the first auxiliary electrode layer 3 and the second auxiliary electrode layer 4 are directly arranged on the base substrate.

The OLED device provided in the embodiments of the present disclosure includes the pixel defining layer 1 formed on the base substrate and the organic light-emitting functional layer 2 in the opening region 11 of the pixel defining layer 1, and further includes the first auxiliary electrode layer 3 and the second auxiliary electrode layer 4 which are arranged on the same layer. The first auxiliary electrode layer 3 and the second auxiliary electrode layer 4 are located between the pixel defining layer 1 and the base substrate, and an electric field can be formed between the first auxiliary electrode layer 3 and the second auxiliary electrode layer 4. The organic light-emitting molecules of the organic light-emitting material 21 in the organic light-emitting functional layer 2 are arranged directionally under the action of the electric field. For the OLED device prepared through wet processes such as ink-jet printing, the present disclosure provides a new solution for organic light-emitting molecule orientation, that is, orientation arrangement of the organic light-emitting molecules is achieved through the electric field. Therefore, the carrier transport rate may be increased, and the hole transport rate matches with the electron transport rate, thereby improving the light-emitting efficiency and prolonging the service life of the OLED device.

Exemplarily, the first auxiliary electrode layer 3 is configured to be connected with the positive pole of a DC power supply 5, and the second auxiliary electrode layer 4 is configured to be connected with the negative pole of the DC power supply 5. The first auxiliary electrode layer 3 and the second auxiliary electrode layer 4 are led out from different ends of the base substrate and are connected with the positive pole and the negative pole of the external DC power supply 5 respectively. Here, different ends refer to different side edges of the base substrate, for example, the opposite two side edges. With such a design, the leads of the two auxiliary electrode layers do not need to be led out from the same end, such that wiring arrangement is easy when the two auxiliary electrode layers are connected with the DC power supply. The first auxiliary electrode layer 3 and the second auxiliary electrode layer 4 can enable the organic light-emitting molecules in the organic light-emitting material 21 to be horizontally arranged. The arrangement direction of the organic light-emitting molecules in the organic light-emitting material 21 is basically consistent with the direction of the electric field, that is, the arrangement direction of the organic light-emitting molecules remains parallel to the plane of the pixel electrode (namely, remains parallel to the plane of the base substrate), so that horizontal orientation of the organic light-emitting molecules is achieved. Compared with the existing random orientation of the organic light-emitting molecules, this horizontal orientation improves the light-emitting efficiency and increases the mobility of carriers, thereby improving the light-emitting efficiency and prolonging the service life of the OLED device. Here, the organic light-emitting molecules being parallel to the plane of the base substrate refers to that the n-electron conjugate plane in the organic light-emitting molecules is parallel to the plane of the base substrate.

With reference to FIG. 1, each of the first auxiliary electrode layer 3 and the second auxiliary electrode layer 4 includes a plurality of strip-shaped electrodes arranged in parallel, and the strip-shaped electrodes in the first auxiliary electrode layer 3 and the strip-shaped electrodes in the second auxiliary electrode layer 4 are alternately arranged at intervals. For example, the strip-shaped electrode in the first auxiliary electrode layer 3, the strip-shaped electrode in the second auxiliary electrode layer 4, the strip-shaped electrode in the first auxiliary electrode layer 3, and the strip-shaped electrode in the second auxiliary electrode layer 4 are shown sequentially from right to left in FIG. 1, and the strip-shaped electrodes are arranged parallel to each other. In the OLED device, one strip-shaped electrode is arranged between two adjacent rows of opening regions or two adjacent columns of opening regions. As shown in FIG. 1, one strip-shaped electrode is arranged between two adjacent columns of opening regions, and the length direction of the strip-shaped electrode is parallel to the direction of one column of opening regions.

Exemplarily, the first auxiliary electrode layer 3 and the second auxiliary electrode layer 4 are made of a highly-conductive material which may be aluminium, molybdenum, neodymium or silver, or an alloy containing at least two of aluminium, molybdenum, neodymium and silver.

In this embodiment, as shown in FIG. 2, the OLED device further includes a first electrode layer 6. The first electrode layer 6 is between the organic light-emitting functional layer 2 and the base substrate, and is spaced apart from the first auxiliary electrode layer 3 and the second auxiliary electrode layer 4 respectively. As shown in FIG. 2, the first electrode layer 6 is spaced apart from the first auxiliary electrode layer 3 and the second auxiliary electrode layer 4 in the horizontal direction, thereby guaranteeing that the first electrode layer 6 is insulated from the first auxiliary electrode layer 3 and the second auxiliary electrode layer 4. That is, the first electrode layer 6 is located in the opening region of the pixel defining layer 1. The pixel defining layer 1 separates the first auxiliary electrode layer 3, the first electrode layer 6 and the second auxiliary electrode layer 4 from each other. The pixel defining layer 1 is made of an insulating material, so that the first auxiliary electrode layer 3 is insulated from the first electrode layer 6 and the first electrode layer 6 is insulated from the second auxiliary electrode layer 4.

The first electrode layer 6 may be a transparent electrode which is made of indium tin oxide, indium zinc oxide or the like.

In this embodiment, the OLED device further includes a second electrode layer (not shown in the figure). The second electrode layer is located at the side, away from the first electrode layer 6, of the organic light-emitting functional layer 2. That is, the organic light-emitting functional layer 2 is clipped between the first electrode layer 6 and the second electrode layer. The organic light-emitting functional layer 2 further includes a hole injection layer, a hole transport layer, an electron transport layer and an electron injection layer. Here, the first electrode layer and the second electrode layer are connected to the power source voltage when the OLED operates, and generate electrons and holes respectively. The electrons pass through the electron injection layer and the electron transport layer sequentially to enter the organic light-emitting functional layer. The holes pass through the hole injection layer and the hole transport layer sequentially to enter the organic light-emitting functional layer. The electrons and the holes recombine in the organic light-emitting functional layer and emit light.

It should be noted that the first electrode layer 6 may be an anode layer and may also be a cathode layer. When the first electrode layer 6 is an anode layer, the second electrode layer is a cathode layer. When the first electrode layer 6 is a cathode layer, the second electrode layer is an anode layer. Since the anode layer needs to be connected with the drain electrode of the thin film transistor on the base substrate, in order to facilitate wiring, the first electrode layer 6 may be an anode layer and the second electrode layer may be a cathode layer, that is, the anode layer is more adjacent to the thin film transistor on the base substrate. In the embodiments of the present disclosure, description is given by taking an example in which the first electrode layer 6 is an anode layer. As shown in FIG. 2, a hole injection layer 22 and a hole transport layer 23 are sequentially formed on the first electrode layer 6. The organic light-emitting material 21 is arranged, as a light-emitting layer, on the hole transport layer 23. An electron transport layer, an electron injection layer and a second electrode layer are further sequentially formed on the organic light-emitting material 21. The hole injection layer 22, the hole transport layer 23, the organic light-emitting material 21, the electron transport layer, and the electron injection layer constitute the organic light-emitting functional layer 2.

The embodiments of the present disclosure further provide an OLED display apparatus which includes the above OLED device. The detailed structure of the OLED device is not described herein.

The OLED display apparatus provided in the present disclosure includes the pixel defining layer formed on the base substrate and the organic light-emitting functional layer in the opening region of the pixel defining layer and further includes the first auxiliary electrode layer and the second auxiliary electrode layer which are arranged on the same layer. The first auxiliary electrode layer and the second auxiliary electrode layer are located between the pixel defining layer and the base substrate, and the electric field may be formed between the first auxiliary electrode layer and the second auxiliary electrode layer. The organic light-emitting molecules of the organic light-emitting material in the organic light-emitting functional layer are arranged directionally under the action of the electric field. For the OLED device prepared through wet processes such as ink-jet printing, the present disclosure provides a new solution for the organic light-emitting molecule orientation, that is, the orientation arrangement of the organic light-emitting molecules is achieved through the electric field. Therefore, the carrier transport rate may be increased to match with the electron transport rate, thereby improving the light-emitting efficiency and prolonging the service life of the OLED device.

Figure 3:
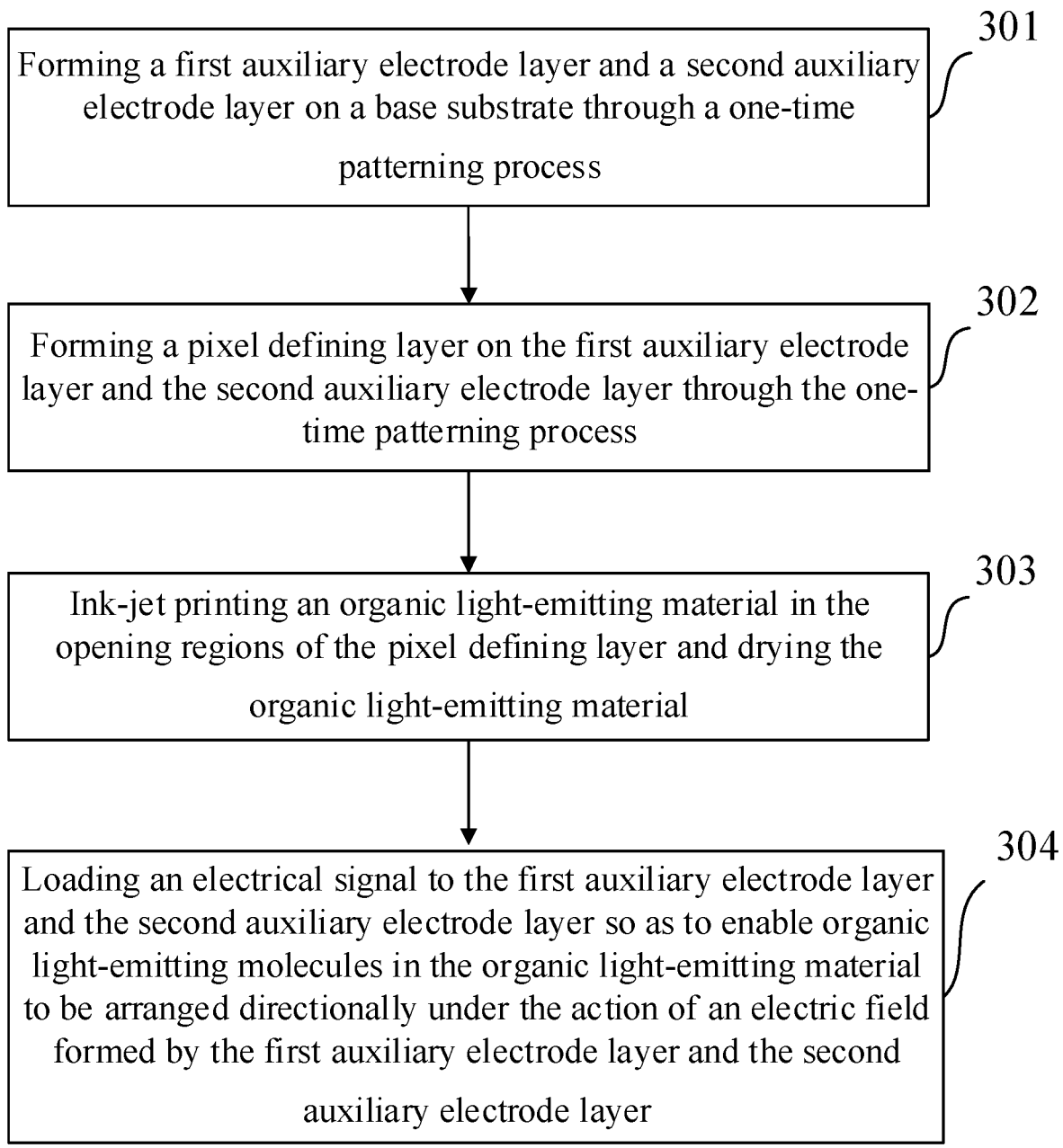
FIG. 3 is a flow chart of a preparation method for an OLED device according to an embodiment of the present disclosure.

The embodiments of the present disclosure further provide a preparation method for an OLED device. The method is used for preparing the OLED device as shown in FIGS. 1 and 2. The OLED device is prepared by using wet processes. The wet process includes, but is not limited to, ink-jet printing, spin-coating, etc., which are prepared through solution. The following description is given by taking an example in which the OLED device is prepared by using ink-jet printing. Wit reference to FIGS. 1-3, the method includes the following steps.

In step 301, a first auxiliary electrode layer and a second auxiliary electrode layer are formed on a base substrate through a one-time patterning process.

By taking the preparation method for the AMOLED device as an example, metal thin films of the first auxiliary electrode layer 3 and the second auxiliary electrode layer 4 are deposited on the base substrate on which a thin film transistor is prepared The metal thin films are made of a highly-conductive metal material, such as aluminium, molybdenum, neodymium or silver, or an alloy containing at least two of aluminium, molybdenum, neodymium and silver. The metal thin film is coated with photoresist and then exposure, developing and etching are performed by using a mask plate to form the first auxiliary electrode layer 3 and the second auxiliary electrode layer 4.

In step 302, a pixel defining layer is formed on the first auxiliary electrode layer and the second auxiliary electrode layer through the one-time patterning process.

Exemplarily, a resin material for preparing the pixel defining layer 1 is deposited on the base substrate on which the first auxiliary electrode layer 3 and the second auxiliary electrode layer 4 are formed. The resin material is coated with photoresist, and exposure, developing and etching are performed by using a mask plate to form the pixel defining layer 1 having a plurality of opening regions 11 arranged in a matrix.

In step 303, an organic light-emitting material is ink-jet printed in the opening regions of the pixel defining layer and then the organic light-emitting material is dried.

Exemplarily, a three-color (red, green and blue) organic light-emitting material 21 is injected into the opening regions 11 through a micron-scale printing head, and the substrate, on which the organic light-emitting material 21 is printed, is transferred to a vacuum drying device for drying, so that an organic light-emitting film layer with uniform thickness is obtained.

In step 304, an electrical signal is loaded to the first auxiliary electrode layer and the second auxiliary electrode layer so as to enable organic light-emitting molecules in the organic light-emitting material to be arranged directionally under the action of an electric field formed by the first auxiliary electrode layer and the second auxiliary electrode layer.

It should be noted that step 304 may be performed when the organic light-emitting material 21 starts to be dried. To save power and realize energy conservation and consumption reduction, the electrical signal may also be loaded to the first auxiliary electrode layer 3 and the second auxiliary electrode 4 when the organic light-emitting film layer in the opening regions 11 starts to become viscous after the organic light-emitting material 21 has been dried for a pre-set time duration, for example, at the end of the drying process of the organic light-emitting material 21. The pre-set time duration is related to the type and thickness of the organic light-emitting material 21 and is usually a few minutes.

Exemplarily, the first auxiliary electrode layer 3 and the second auxiliary electrode layer 4 are configured to be connected with the positive pole and the negative pole of a DC power supply 5 respectively and the DC power supply 5 is turned on, so that a horizontal electric field is formed between the first auxiliary electrode layer 3 and the second auxiliary electrode layer 4. The organic light-emitting molecules in the organic light-emitting material 21 are arranged horizontally under the action of the electric field.

It can be seen from above steps 301-304, for the OLED device prepared through wet processes such as ink-jet printing, the present disclosure provides a new solution for organic light-emitting molecule orientation scheme, that is, the orientation arrangement of the organic light-emitting molecules is achieved through the electric field. Therefore, the carrier transport rate may be increased to match with the electron transport rate, thereby improving the light-emitting efficiency and prolonging the service life of the OLED device.

In this embodiment, optionally, before step 302, the method further includes the following step: forming a first electrode layer 6 on the base substrate through the one-time patterning process, wherein the first electrode layer 6 is spaced apart from the first auxiliary electrode layer 3 and the second auxiliary electrode layer 4 respectively, and keeps disconnected. In step 302, the pixel defining layer 1 completely covers the first auxiliary electrode layer 3 and the second auxiliary electrode layer 4 as well as the periphery of the first electrode layer 6, such that the first electrode layer 6 is spaced apart from the first auxiliary electrode layer 3 and the second auxiliary electrode layer 4 respectively through the pixel defining layer 1. It should be noted that the execution sequence of this step and step 301 is not limited. The first electrode layer 6 may be a transparent electrode which is made of indium tin oxide, indium zinc oxide or the like. In this case, the step of preparing the first electrode layer 6 is not performed simultaneously with step 301 and may be performed before or after step 301.

Before step 303, the method may further include the following steps: sequentially forming the hole injection layer 22 and the hole transport layer 23 on the first electrode layer 6 through the one-time patterning process and, drying and annealing the hole injection layer 22 and the hole transport layer 23 respectively. For example, the hole injection layer 22 and the hole transport layer 23 are sequentially formed on the first electrode layer 6 through an ink-jet printing method.

In step 303, the organic light-emitting material 21 is printed in the opening regions 11 of the pixel defining layer 1 and the organic light-emitting material 21 is formed on the hole transport layer 23.

In this embodiment, optionally, after step 304, the method further includes the following steps; forming an electron transfer layer and an electron injection layer sequentially through the one-time patterning process on an organic light-emitting film formed after the organic light-emitting material 21 is dried; and forming a second electrode layer on the base substrate, on which the electron injection layer is formed through the one-time patterning process.

For the OLED device prepared through wet processes such as ink-jet printing, the present disclosure provides an organic light-emitting molecule orientation technique. By arranging the first auxiliary electrode layer and the second auxiliary electrode layer below the pixel defining layer, the first auxiliary electrode layer and the second auxiliary electrode layer are connected with the positive pole and the negative pole of the DC power supply respectively. The organic light-emitting molecules are induced to be arranged directionally by applying a direct-current electric field at two sides of each pixel, thereby achieving the purpose of molecule orientation. This solution is especially suitable for molecule orientation of the OLED device prepared through a solution. Thus, control over the carrier transport rate and the organic light-emitting molecule orientation is realized and the purpose of improving the efficiency and performance of the OLED device is achieved.

The above description is only exemplary embodiments of the present disclosure, and is not intended to limit the present disclosure. Any modifications, equivalent replacements, improvements and the like made within the spirit and principles of the present disclosure should be included within the scope of protection defined by the appended claims of the present disclosure.

What is claimed is:

1. An OLED device, comprising a pixel defining layer, an organic light-emitting functional layer and an auxiliary electrode layer on a base substrate, wherein the organic light-emitting functional layer is in opening regions of the pixel defining layer and comprises an organic light-emitting material in which organic light-emitting molecules are directionally arranged;

the auxiliary electrode layer is configured to form an electric field in the opening regions, the organic light-emitting molecules in the organic light-emitting material are directionally arranged under the action of the electric field, and the organic light-emitting material is prepared through ink-jet printing.

2. The OLED device according to claim 1, wherein the auxiliary electrode layer is made of one of the following materials:

aluminium, molybdenum, neodymium and silver, or an alloy formed by at least two of: aluminium, molybdenum, neodymium and silver.

3. The OLED device according to claim 1, further comprising a first electrode layer and a second electrode layer, wherein the first electrode layer is between the organic light-emitting functional layer and the base substrate and is spaced apart from the auxiliary electrode layer, and the second electrode layer is on the organic light-emitting functional layer.

4. The OLED device according to claim 3, wherein the first electrode layer is one of an anode layer or and a cathode layer, and the second electrode layer is the other one of the anode layer and the cathode layer.

5. The OLED device according to claim 1, wherein the directional arrangement is parallel to the base substrate.

6. The OLED device according to claim 1, wherein the auxiliary electrode layer comprises a first auxiliary electrode layer and a second auxiliary electrode layer; the first auxiliary electrode layer and the second auxiliary electrode layer are on the same layer and are encapsulated by the pixel defining layer to be between the pixel defining layer and the base substrate.

7. The OLED device according to claim 6, wherein the first auxiliary electrode layer and the second auxiliary electrode layer are configured to be connected with a positive pole and a negative pole of a DC power supply respectively.

8. The OLED device according to claim 7, wherein the first auxiliary electrode layer and the second auxiliary electrode layer are led out from different side edges of the base substrate respectively to be connected with the positive pole and the negative pole of the DC power supply.

9. The OLED device according to claim 6, wherein the pixel defining layer has a plurality of opening regions arranged in a matrix;

each of the first auxiliary electrode layer and the second auxiliary electrode layer comprises a plurality of strip-shaped electrodes arranged in parallel; the strip-shaped electrodes in the first auxiliary electrode layer and the strip-shaped electrodes in the second auxiliary electrode layer are alternately arranged at intervals, and the strip-shaped electrodes are arranged in one of the following two ways:

one strip-shaped electrode is arranged between two adjacent rows of opening regions; and one strip-shaped electrode is arranged between two adjacent columns of opening regions.

10. An OLED display apparatus, comprising an OLED device, wherein the OLED device comprises a pixel defining layer, an organic light-emitting functional layer and an auxiliary electrode layer formed on a base substrate, wherein the organic light-emitting functional layer is in opening regions of the pixel defining layer and comprises an organic light-emitting material in which the organic light-emitting molecules are directionally arranged; and the auxiliary electrode layer is configured to form an electric field in the opening regions, the organic light-emitting molecules in the organic light-emitting material are directionally arranged under the action of the electric field, and the organic light-emitting material is prepared through ink-jet printing.

11. The OLED display apparatus according to claim 10, wherein the directional arrangement is parallel to the base substrate.

12. The OLED display apparatus according to claim 10, wherein the auxiliary electrode layer comprises a first auxiliary electrode layer and a second auxiliary electrode layer; the first auxiliary electrode layer and the second auxiliary electrode layer are on the same layer and are encapsulated by the pixel defining layer to be between the pixel defining layer and the base substrate.

13. The OLED display apparatus according to claim 12, wherein the first auxiliary electrode layer and the second auxiliary electrode layer are configured to be connected with a positive pole and a negative pole of a DC power supply respectively.

14. The OLED display apparatus according to claim 13, wherein the first auxiliary electrode layer and the second auxiliary electrode layer are led out from different side edges of the base substrate respectively to be connected with the positive pole and the negative pole of the DC power supply.

15. The OLED display apparatus according to claim 12, wherein the pixel defining layer has a plurality of opening regions arranged in a matrix;
each of the first auxiliary electrode layer and the second auxiliary electrode layer comprises a plurality of strip-shaped electrodes arranged in parallel; the strip-shaped electrodes in the first auxiliary electrode layer and the strip-shaped electrodes in the second auxiliary electrode layer are alternately arranged at intervals; and the strip-shaped electrodes are arranged in one of the following two ways:
one strip-shaped electrode is arranged between two adjacent rows of opening regions; and
one strip-shaped electrode is arranged between two adjacent columns of opening regions.

16. A preparation method for an OLED device, comprising:
forming an auxiliary electrode layer and a pixel defining layer on a base substrate;
preparing an organic light-emitting material in opening regions of the pixel defining layer, and forming an electric field which enables organic light-emitting molecules in the organic light-emitting material to be arranged directionally in the opening regions of the pixel defining layer through the auxiliary electrode layer.

17. The method according to claim 16, wherein forming the auxiliary electrode layer and the pixel defining layer on the base substrate comprises:
forming a first auxiliary electrode layer and a second auxiliary electrode layer on the base substrate through a one-time process, wherein the auxiliary electrode layer comprises the first auxiliary electrode layer and the second auxiliary electrode layer; and forming the pixel defining layer on the first auxiliary electrode layer and the second auxiliary electrode layer through a one-time process, wherein both the first auxiliary electrode layer and the second auxiliary electrode layer are encapsulated by the pixel
defining layer to be between the pixel defining layer and the base substrate.

18. The method according to claim 17, wherein forming the electric field which enables organic light-emitting molecules in the organic light-emitting material to be arranged directionally in the opening regions of the pixel defining layer through the auxiliary electrode layer comprises:
connecting the first auxiliary electrode layer and the second auxiliary electrode layer with a positive pole and a negative pole of a DC power supply respectively and turning on the DC power supply.

19. The method according to claim 17, wherein before forming the pixel defining layer on the first auxiliary electrode layer and the second auxiliary electrode layer through the one-time patterning process, the method further comprises:
forming a first electrode layer on the base substrate through the one-time patterning process, wherein the first electrode layer is spaced apart from the first auxiliary electrode layer and the second auxiliary electrode layer respectively.

20. The method according to claim 16, further comprising:
drying the organic light-emitting material; and
forming the electric field which enables organic light-emitting molecules in the organic light-emitting material to be arranged directionally in the opening regions of the pixel defining layer through the auxiliary electrode layer comprises:
loading an electrical signal to the auxiliary electrode layer after the organic light-emitting material is dried for a pre-set time duration, to generate the electric field in the opening regions of the pixel defining layer.

* * * * *